(12) United States Patent
Lin (10) Patent No.: US 6,670,897 B1
(45) Date of Patent: Dec. 30, 2003

(54) COMPRESSION/DECOMPRESSION TECHNIQUES BASED ON TOKENS AND HUFFMAN CODING

(75) Inventor: Brain Lin, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/264,185

(22) Filed: Oct. 3, 2002

(51) Int. Cl.⁷ .............................................. H03M 7/40
(52) U.S. Cl. ...................................................... 341/65
(58) Field of Search ............................. 341/65, 50, 51, 341/64

(56) References Cited

U.S. PATENT DOCUMENTS

| | | |
|---|---|---|
| 4,558,302 A | 12/1985 | Welch |
| 4,560,976 A | 12/1985 | Finn |
| 4,597,057 A | 6/1986 | Snow |
| 4,747,053 A | 5/1988 | Yoshimura et al. |
| 4,899,148 A | 2/1990 | Sato et al. |
| 5,049,881 A | 9/1991 | Gibson et al. |
| 5,051,745 A | 9/1991 | Katz |
| 5,281,967 A | 1/1994 | Jung |
| 5,396,595 A | 3/1995 | Standley |
| 5,442,350 A | 8/1995 | Iyer et al. |
| 5,530,645 A | 6/1996 | Chu |
| 5,594,435 A | 1/1997 | Remillard |
| 5,691,717 A | 11/1997 | Tamura |
| 5,815,096 A | 9/1998 | Smith |
| 5,930,756 A | 7/1999 | Mackie et al. |
| 5,956,724 A | 9/1999 | Griffiths |
| 6,047,298 A | 4/2000 | Morishita |
| 6,061,398 A | 5/2000 | Satoh et al. |
| 6,100,824 A | 8/2000 | MacLeod et al. |
| 6,484,142 B1 * | 11/2002 | Miyasaka ..................... 341/65 |

OTHER PUBLICATIONS

Huffman, David A., "A Method for the Construction of Minimum–Redundancy Codes", Proceedings of the IRE, vol. 40, No. 9, Sep. 1952, pp. 1098–1101.
Ziv, Jacob et al., "A Universal Algorithm for Sequential Data Compression", IEEE Transactions on Information Theory, vol. 23, No. 3, May 1977, pp. 337–343.
Ziv, Jacob et al., "Compression of Individual Sequences Via Variable–Rate Coding", IEEE Transactions on Information Theory, vol. 24, No. 5, Sep. 1978, pp. 530–536.
Nelson, Mark et al., The Data Compression Book, 2nd Edition, 1995, pp. 29–31, 201–204, 215–226, and 255–271.

* cited by examiner

*Primary Examiner*—Brian Young
(74) *Attorney, Agent, or Firm*—Vedder, Price, Kaufman & Kammholz, P.C.

(57) ABSTRACT

Huffman coding (302) is first performed on uncompressed data (402) to obtain Huffman data (406). Additionally, the frequencies of one or more variable-length bit strings are also determined (408). At least one bit string is selected (304) when compression savings provided by the at least one bit string compares favorably with compression savings provided by the Huffman data. The Huffman data (406) is modified to account for the selection of the at least one bit string. Thereafter, compression is performed (306, 308) on the uncompressed data based on token replacements for the at least one bit string and, where necessary, on the modified Huffman data (420). In this manner, performance will be no worse than those techniques that employ Huffman coding. Using the present invention, greater compression efficiencies may be achieved without knowledge of the data being compressed while still preserving random accessibility of the data being compressed.

34 Claims, 6 Drawing Sheets

COMPRESSION/DECOMPRESSION TECHNIQUES BASED ON TOKENS AND HUFFMAN CODING

TECHNICAL FIELD

The present invention relates generally to data compression/decompression schemes and, in particular, to a technique for compressing and decompressing data based on tokens and Huffman coding.

BACKGROUND OF THE INVENTION

Wireless communication systems are well known in the art. In such systems, communications (particularly voice communications) are typically supported by a wireless infrastructure that supports wireless communications with and between one or more wireless communication devices (or mobile devices), such as cellular phones, portable two-way radios, wirelessly-enabled personal digital assistants, etc. Increasingly, suppliers of such mobile devices are working toward the provision of more than just voice communications. For example, in addition to audio information, such communication devices are now capable of providing image and video information to users.

Increasingly, information that can be provided by today's mobile devices can be classified as static data items (i.e., data that is created once and used repeatedly thereafter) such as fonts, image libraries, audio libraries, prompts, dictionaries, etc. Such static items may often require substantial storage resources. Therefore, it is desirable to compress such data for delivery to, and/or storage in, mobile devices that typically have limited storage resources. Compression is typically a resource-intensive process, whereas decompression should be relatively fast and efficient. While the compression of static data items is typically performed once on relatively powerful host or network-based computers, decompression is performed repeatedly on such mobile devices. In order to maximize efficiency, it is further preferable that each particular data item within a collection of previously compressed items be randomly-accessible, i.e., capable of being decompressed individually without having to decompress the remainder of the collection.

While various techniques exist for performing such compression, they generally suffer from various shortcomings. For example, Huffman coding is known to provide reasonable compression performance while simultaneously preserving random accessibility of individual data items. Huffman coding may generally be applied to virtually any type of data, resulting in varying levels of compression efficiency. As used herein, compression efficiency or compression savings refers to ratios of compressed data size to uncompressed data size; improved efficiency or better savings results in lower ratios. Other techniques are known that improve the compression efficiency based on knowledge of the characteristics of the data to be compressed. Still other techniques, such as the so-called LZ77 or LZ78 techniques, also provide greater compression efficiency at the expense of random accessibility.

Therefore, it would be advantageous to provide a technique for compressing and decompressing data that provides good compression efficiency without the need for significant memory or other resource requirements, without requiring detailed knowledge of the characteristics of the data being compressed and that preserves random accessibility to individual data items.

DETAILED DESCRIPTION OF THE PREFERRED EMBODIMENTS

The present invention provides an efficient, effective technique for compressing and decompressing virtually any type of data without prior knowledge of the characteristics of the data while still preserving random accessibility to individual items within the compressed data. To this end, the present invention combines Huffman coding with token-based compression to provide greater compression efficiency, ease of decompression and random accessibility. Given uncompressed data, which may comprise one or more data items in a collection, Huffman coding is first performed on the uncompressed data to obtain Huffman data (i.e., information concerning the frequency of occurrence of various symbols or patterns within the data and variable-length codes used to represent them). Additionally, the frequencies of one or more variable-length bit strings are determined using a scanning process on the uncompressed data. At least one bit string is selected, based at least in part upon the frequencies of occurrence of the one or more bit strings, when compression savings provided by the at least one bit string compares favorably with compression savings provided by the Huffman data. In one embodiment, if no bit string is deemed favorable compared with the Huffman data, compression is performed based on the Huffman data. Assuming at least one favorable bit string is identified, compression is thereafter performed on the uncompressed data based on token replacements for the at least one bit string. Preferably, this is accomplished by replacing each of the at least one bit string with corresponding fixed-length tokens and an escape code. Additionally, the Huffman data is modified to account for the selection (and removal by virtue of replacement) of the at least one bit string in the uncompressed data to provide modified Huffman data. The uncompressed data is also compressed based on the modified Huffman data. Because the token-based and Huffman data-based compression is performed "in-place", random accessibility of individual data items is preserved. In the event that no favorably performing bit strings are identified, the original Huffman data may be used to compress the data. In this manner, performance will be no worse than those techniques that employ Huffman coding. Information regarding the escape code, correspondence of the at least one bit string to at least one fixed-length token, the Huffman data and the resulting compressed data may be transmitted to a receiver for decompression of the compressed data by the receiver. Using the present invention, greater compression efficiencies may be achieved without knowledge of the data being compressed while still preserving random accessibility of the data being compressed.

Figure 1:
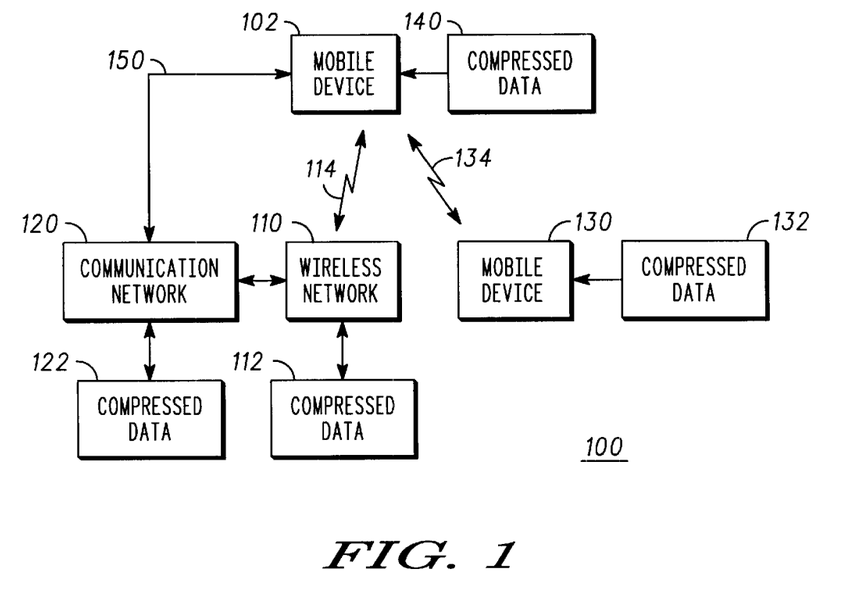
FIG. 1 is a block diagram of a wireless communication system in accordance with an embodiment of the present invention.

These and other advantages of the present invention are more fully described with further reference to FIGS. 1–10 below. Referring now to FIG. 1, a wireless communication system 100 includes at least one mobile device 102, 130 in wireless communication with a wireless network or infrastructure 110 or each other via at least one wireless channel 114, 134. The mobile devices 102, 130, illustrated in greater detail below with reference to FIG. 2, may include any wireless communication devices at least capable of receiving information streams that include compressed data, such as cellular phones, two-way radios, wirelessly-enabled personal digital assistants or computers, etc. Although the present invention is primarily applicable to mobile devices, in may be beneficially applied to any type of communication device, including non-mobile devices such as traditional, landline telephones, computers and the like. The wireless infrastructure 110 includes those elements necessary to support such wireless communications, as known in the art, the particulars of which elements will vary according to the type of system 100 employed. Such elements typically include base stations, resource controllers, transcoders, switches, and a variety of other elements known to those having ordinary skill in the art. The wireless channels 114, 134 are likewise dependent upon the nature of the system 100 implemented. In general, however, the wireless channels 114, 134 may include any wireless resources such as radio frequency (RF) channels, infrared channels, etc. supporting any suitable modulation protocol (e.g., frequency modulation, amplitude modulation, etc.) and/or access protocol, such as frequency-division multiplexed (FDM), time-division multiplexed (TDM) or code-division multiplexed (CDM) protocols. Note that the wireless channel labeled with reference numeral 134 may be provided in support of mobile-to-mobile communications such that the mobile devices 102, 130 may communicate with each other without intervention of the wireless infrastructure 110.

FIG. 1 particularly illustrates the manner in which compressed data may be provided to, for example, a first mobile device 102 from a plurality of compressed data sources 112, 122, 132, 140. The compressed data sources 112, 122, 132, 140 may comprise any device or combination of devices capable of supplying compressed data. Uncompressed data, in the context of the present invention, includes any type of information (e.g., voice, audio, text, machine-readable code, etc.) susceptible to digital representation. Compressed data, in turn, may comprise any uncompressed data that has been subjected to the compression process of the present invention. In simplest form, the compressed data sources 112, 122, 132, 140 may be embodied as simple storage devices (e.g., memory cards) or computers having compressed data (compressed elsewhere) stored thereon. Where the compressed data sources 132, 140 are associated with mobile devices 102, 130, it is anticipated that such storage-only type implementations will be preferred. In another embodiment, the compressed data sources 112, 122, 132, 140 comprise computer-based platforms capable of not only storing the compressed data, but also capable of performing the compression techniques of the present invention. Additionally, although the compressed data sources 112, 122, 132, 140 are illustrated in FIG. 1 apart from the system elements with which they are associated, it is possible that any or all of the sources 112, 122, 132, 140 may be incorporated into the respective system element with which they are associated.

Figure 2:
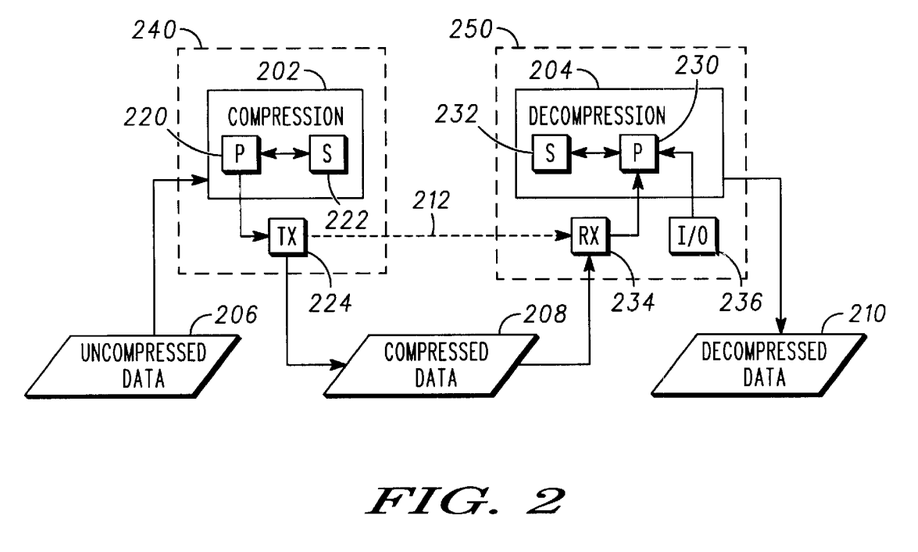
FIG. 2 is a block diagram illustrating devices incorporating data compression and decompression in accordance with an embodiment of the present invention.

As illustrated in FIG. 1, compressed data may be provided to the first mobile device 102 from a variety of sources. For example, a first compressed data source 112 may be coupled to the wireless infrastructure 110 such that content from the first content source 112 may provided to the first mobile device 102 via a wireless channel 114. Alternatively, the first mobile device 102 may be coupled to a communication network 120 via a direct connection 150 or via the wireless infrastructure 110. In this manner, a second compressed data source 122 may coupled to the first mobile device 102. In practice, the communication network 120 may comprise a public network such as the Internet or World Wide Web, a private network such as a corporate intranet, or a combination of public and private network elements. Regardless, where the compressed data source 112, 122 is coupled to the first mobile device 102 via an intervening network, the compressed data source 112, 122 may be embodied by a computer-based server platform of the type well known in the art. In yet another embodiment, a third compressed data source 132 may be coupled to the first mobile device 102 via another mobile unit 130 and wireless channel 134. Finally, a fourth compressed data source 140 may be coupled directly to the first mobile device 102. Referring now to FIG. 2, devices 240, 250 that include elements for performing compression 202 and decompression processing 204, respectively, in accordance with the present invention are illustrated. As described above, a first device 240 including the compression element 202 may be a personal computer or other similar high-performance computer platform depending on the speed requirement of the compression and the size of uncompressed data. Conversely, a second device 250 including the decompression element 204 will typically comprise a platform having relatively limited processing and storage resources, such as a wireless communication unit of the type described above. Nevertheless, it is understood that the present invention may be equally employed in systems in which the receiving (second) device is embodied by a more powerful computer-based platform, or even a typically non-mobile device, such as a desktop computer.

Operating upon uncompressed data 206, the compression element 202 provides compressed data 208 and compression parameters 212 as output. The uncompressed data 206 preferably resides in suitable storage devices, although the use of streaming uncompressed data may be accommodated. Likewise, the compressed data 208 and compression parameters 212 are preferably provided directly to a storage device but may also be provided in streaming form. As described below (e.g., FIG. 8), the compression parameters 212 comprise information or data that is used by the decompression element 204 when decompressing the compressed data 208.

The compression element 202 may comprise any suitable mechanism for carrying out the compression processing of the present invention. For example, the compression element 202 may be embodied as a suitably programmed microprocessor, microcontroller, programmable logic, application-specific integrated circuit, etc. or combinations thereof. In the embodiment illustrated in FIG. 2, the compression element 202 comprises a processor 220, such as a microprocessor, microcontroller, digital signal processor, co-processor, etc., coupled to a one or more storage devices 222, such as volatile (e.g., random access memory) or non-volatile (e.g., electrically-erasable programmable read-only memory) memory suitable for non-persistent or persistent storage of data or executable instructions. Additionally, the first device 240 includes a transmitter 224 for transmitting the compressed data 208 and the compression parameters 212 to a receiving device 250. Those having ordinary skill in the art will appreciate that the form of the transmitter 224 depends upon the nature of the first device 240. For example, where the first device 240 comprises a fixed, network- or infrastructure-based computer, the transmitter 224 may comprise a network interface card.

The decompression element 204 operates upon the compressed data 208 based at least in part upon the compression parameters 212 to provide decompressed data 210. As shown, the second device 250 comprises a receiver 234 arranged to receive the compressed data 208 and the compression parameters 212. As with the transmitter 224, those having ordinary skill in the art will again appreciate that the particular form of the receiver 234 depends upon the nature of the second device 250. For example, where the second device 250 is a wireless communication unit, the receiver 234 may be a wireless receiver of the type well known in the art.

The receiver 234 provides the compressed data 208 and the compression parameters 212 to the decompression element 204. The decompression element 204 may comprise any suitable mechanism for carrying out the decompression processing of the present invention. For example, the decompression element 204 may be embodied as a suitably programmed microprocessor, microcontroller, programmable logic, application-specific integrated circuit, etc. or combinations thereof. In the embodiment illustrated in FIG. 2, the decompression element 204 comprises a processor 230, such as a microprocessor, microcontroller, digital signal processor, co-processor, etc., coupled to a one or more storage devices 232, such as volatile (e.g., random access memory) or non-volatile (e.g., electrically-erasable programmable read-only memory) memory suitable for non-persistent or persistent storage of data or executable instructions. In one embodiment of the present invention, the processing techniques described below for compressing and uncompressing data are implemented as stored software routines executed by processors 220, 230.

The second device 250 also includes one or more input/output devices 236. The input/output devices 236 include other mechanisms by which signals are provided to/from the processor 230. For example, the input/output devices 236 may include a microphone, touch-screen, alphanumeric keypad, various buttons, soft keys, switches, dials or other user-actuable devices as known in the art. Likewise, various types of output devices may be employed, such as display screens, light emitting diodes (LEDs), annunciators, vibrators and the like. The nature and extent of the input/output devices 236 is a matter of design choice, and the present invention need not be limited in this regard. In one embodiment of the present invention, the input/output devices 212 include mechanisms for a user to select a particular data item within the compressed data 208 based on data item index information sent as a portion of the compression parameters 212.

Figure 3:
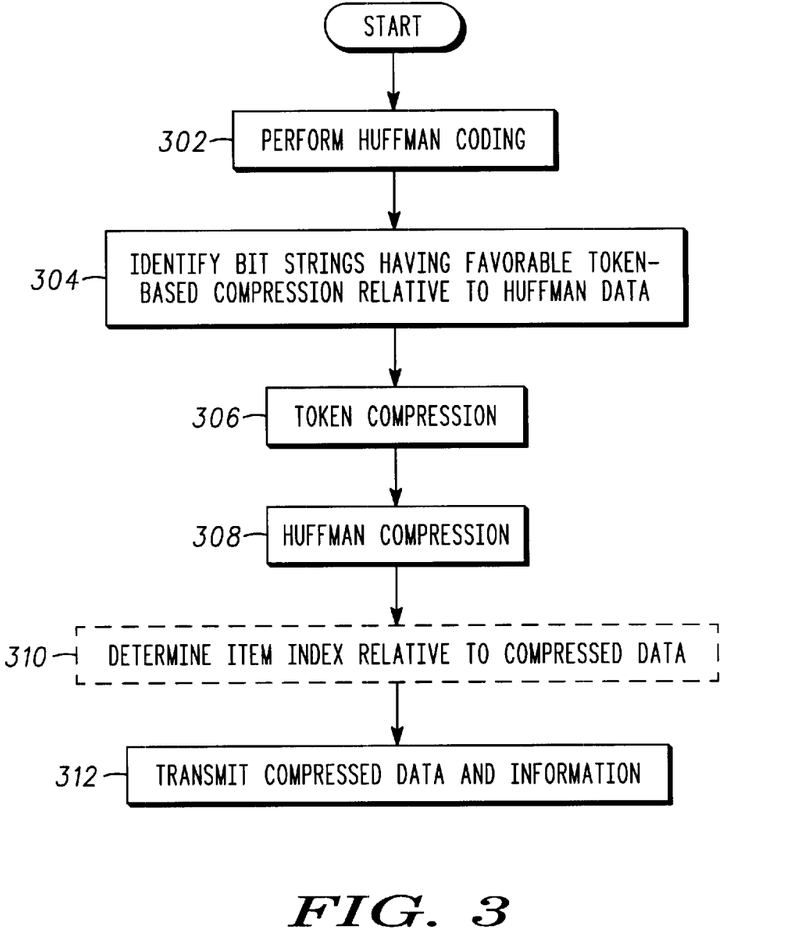
FIG. 3 is a flow chart illustrating a method for compressing data in accordance with an embodiment of the present invention.
Figure 4:
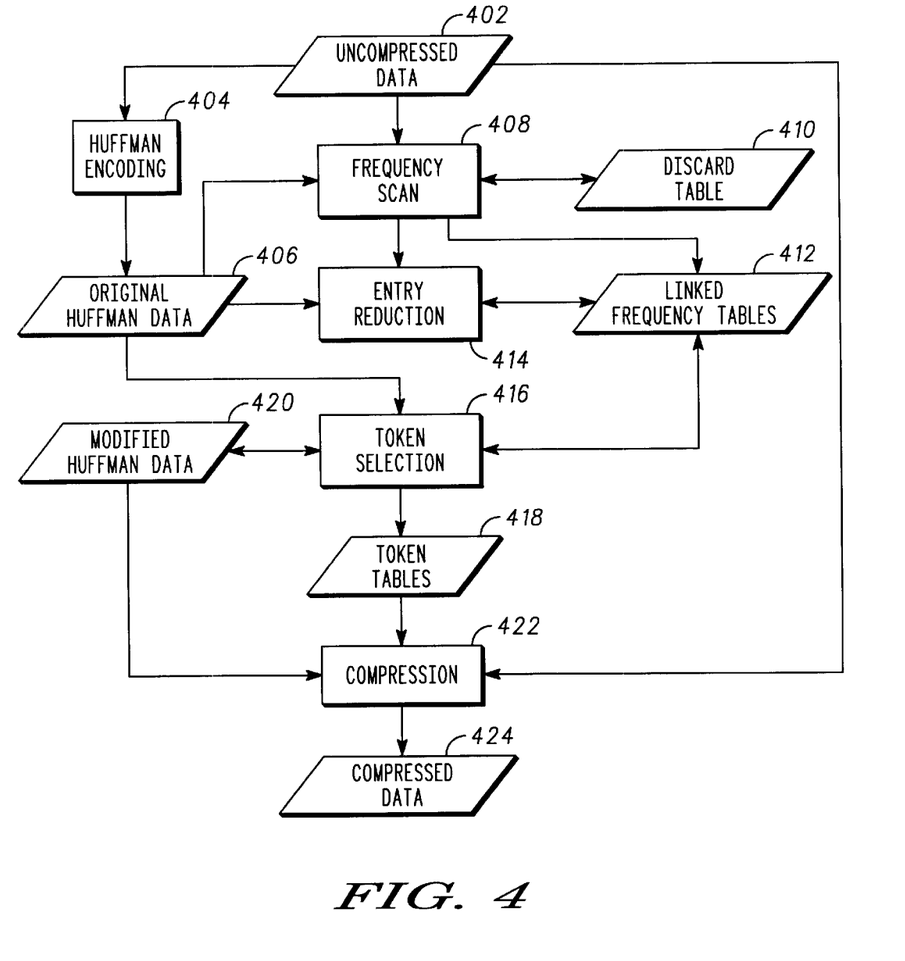
FIG. 4 is a block diagram illustrating data flow and compression-related processing in accordance with an embodiment of the present invention.

Referring now to FIGS. 3–8, compression of data items in accordance with an embodiment of the present invention is further illustrated. In particular, FIG. 3 illustrates a method for compression in accordance with the present invention and FIG. 4 illustrates data flow in accordance with the method. In one embodiment of the present invention, the processing described with reference to FIGS. 3 and 4 may be implemented as stored software routines executed by processors, as described above. Those having ordinary skill in the art will recognize that other techniques for implementing such processes, including the use of dedicated circuitry and the like, may be equally employed as a matter of design choice.

Beginning at block 302, Huffman coding 404 is performed on uncompressed data 402 to generate original Huffman data 406. The uncompressed data 402 may comprise a single data item (e.g., a discrete quantity of data such as a text or image file or the like) or a series of data items. Preferably, 0-order Huffman coding is used. Although Huffman coding of higher orders could be used, thereby realizing greater compression efficiencies, the significantly increased complexity of such schemes typically prevents their use in practice. Further still, Huffman coding is one example of random-accessible minimum redundancy compression coding schemes that may be used in connection with the present invention. For example, similar schemes include the so-called Arithmetic Coding and Shannon-Fano schemes.

As known in the art, 0-order Huffman coding involves inspecting the uncompressed data one byte at a time and noting the frequency of occurrence of each different one-byte pattern to provide the Huffman data. Thus, there are 256 possible one-byte patterns, each having a different frequency of occurrence. Based on this frequency data, Huffman encoding assigns relatively short (i.e., less than a byte in length), variable length codes to the most frequently occurring one-byte patterns and assigns longer, variable length codes to the least frequently occurring one-byte patterns. The variable length codes may be arranged into a binary tree structure with the codes corresponding to the most frequently occurring one-byte patterns residing closer to the root of the binary tree and the least frequently occurring one-byte patterns residing closer to the leaves of the binary tree. By substituting such variable length codes in the uncompressed data, the overall number of bits used to represent the data is decreased thereby giving rise to a compression savings. Decoding of data compressed in this manner is achieved by serially using bits from the compressed data to traverse the binary coding tree. When a leaf node is reached, the corresponding one-byte pattern is substituted for the code. In this manner, the compressed data is decompressed back to its original length. The present invention improves upon the compression performance of 0-order Huffman coding by incorporating the use of token-based compression such that overall compression performance is likely improved and, in most cases, no worse than the compression performance achieved by the lower-order Huffman coding.

Referring once again to FIG. 3, at block 304, variable length bit strings within the compressed data are identified having favorable compression savings relative to the compression savings otherwise possible through the use of the Huffman data. To this end, a two step process is employed in which, first, candidate variable length bit strings are identified for token-based compression 408, 414 and, second, specific variable length bit strings offering the best compression performance relative to the Huffman coding are selected 416.

The process of determining candidate bit strings employs the use of scanning 408 to determine the frequencies of such variable length bit strings in a manner akin, but not identical, to that used by nth-order Huffman coding. In particular, a multi-byte length scanning window is employed to perform multiple forward scans of the uncompressed data to identify frequencies of occurrence of bit strings preferably having lengths no less than two bytes up to the maximum byte length of the scanning window. Each forward scan is characterized by an initial sub-string determination, followed by a frequency determination scan and, finally, a comparison of identified bit strings with the Huffman data. After each forward scan, the scan window is advanced by an integer number of bytes and the process is repeated until the scan window has been applied to all of the uncompressed data. This may be explained in greater detail with further reference to FIGS. 5A and 5B.

Figure 5A:
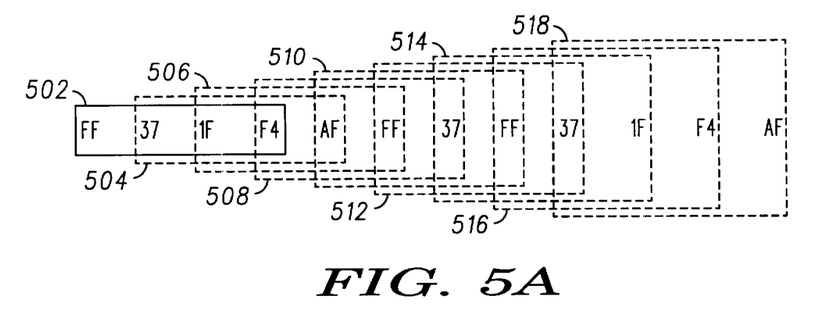
FIGS. 5A and 5B illustrate forward scanning performed on uncompressed data in accordance with an embodiment of the present invention.
Figure 5B:
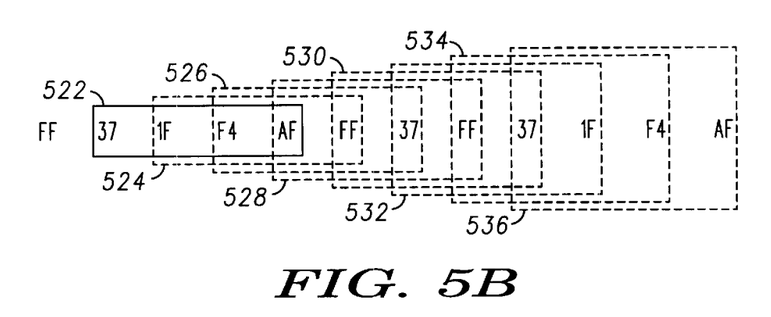

FIGS. 5A and 5B illustrate a simple example of performing forward scans in accordance with the present invention. In the example shown, it is assumed that a four-byte long scanning window is being used. However, it is understood that scan windows of varying lengths could be used as a matter of design and performance choice. The exemplary uncompressed data includes twelve bytes (in hexadecimal notation): 0xFF, 0x37, 0x1F, 0xF4, 0xAF, 0xFF, 0x37, 0xFF, 0x37, 0x1F, 0xF4, 0xAF. Note that a small amount of uncompressed data is used in this example for ease of illustration. In practice, it is expected that the uncompressed data being operated upon will typically comprise thousands of bytes having various byte-wise frequency distributions. An initial scan window position 502 is illustrated in which the four-byte scan window logically encompasses the first four bytes of the uncompressed data. Within the initial scan window, all bit strings from two bytes in length up to the full length of the scan window are determined. This results in the identification of five initial bit strings (in this example) shown in the leftmost column of Table 1 below. In practice, the number of initial bit strings identified will depend on the length of the scan window employed, which length may be predetermined or user-configurable.

TABLE 1

| Initial Bit String | Frequency | Freq. Table/Discard |
| --- | --- | --- |
| 0xFF, 0x37, 0x1F, 0xF4 | 2 | Freq. Table |
| 0xFF, 0x37, 0x1F | 2 | Freq. Table |
| 0x37, 0x1F, 0xF4 | 2 | Discard |
| 0xFF, 0x37 | 3 | Freq. Table |
| 0x37, 0x1F | 2 | Freq. Table |
| 0x1F, 0xF4 | 2 | Discard |

Figure 6:
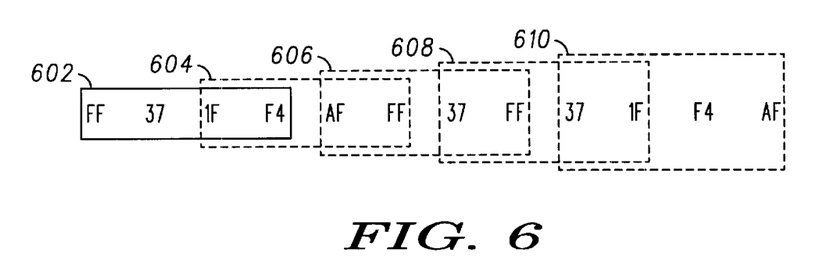
FIG. 6 illustrates forward scanning performed on uncompressed data in accordance with another embodiment of the present invention.

After all possible initial bit strings have been determined, the frequency determination of each of the initial bit strings within the remainder of the uncompressed data is performed. To this end, the scan window is advanced, in this case, one byte. Now, the scan window 504 logically encompasses the second four bytes of the uncompressed data, 0x37, 0x1F, 0xF4, 0xAF. Based on the new byte (in this case, 0xAF) added to the advanced scan window 504, new bit strings inclusive of the new byte are determined and compared against the initial bit strings. Bit strings in the advanced scan window 504 that do not match the initial bit strings are ignored for the moment. However, the occurrence of one of the initial bit strings in the advanced scan window 504 causes the frequency of the matching initial bit string to be incremented. This processes is repeated with multiple advanced scan windows 506–518 until the end of the uncompressed data has been reached. Thus, referring again to Table 1, the frequency of the four-byte initial bit string (0xFF, 0x37, 0x1F, 0xF4) is incremented when the scan window has advanced to the position designated by reference numeral 512. Similarly, the first of the two-byte initial bit patterns (0xFF, 0x37) is incremented when the scan window has advanced to the positions designated by reference numerals 508 and 512. Note that the scan window may be advanced any integer number of bytes when performing the frequency determination scans. An example of this is illustrated in FIG. 6 where, after the initial scan window 602, the advanced scan windows 604–610 each arise from advancement of the scan window by two bytes.

With the frequencies of the five initial bit strings determined, any bit string having a frequency of one is discarded. In this example, none of the five initial bit strings is discarded for this reason as they all have frequencies of at least two. At the end of this first forward scan, each of the multiply-occurring initial bit strings and their corresponding frequencies of occurrence are known and temporarily stored in linked frequency tables 412.

Figure 7:
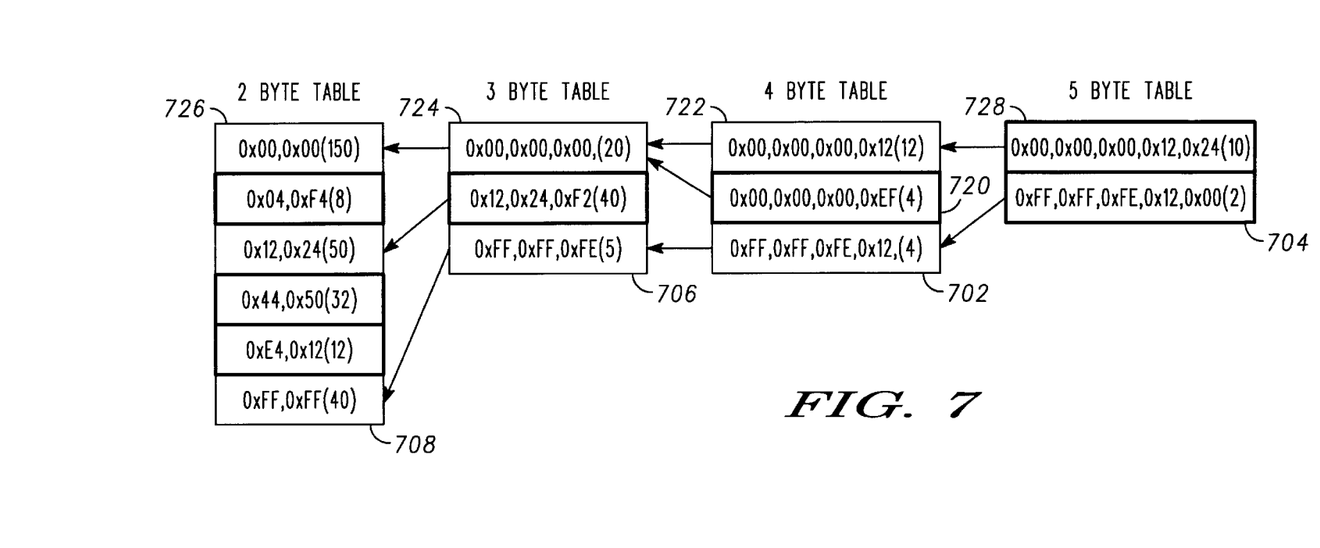
FIG. 7 is a schematic illustration of frequency tables employed during compression processing in accordance with an embodiment of the present invention.

An exemplary set of linked frequency tables 412 is further illustrated with reference to FIG. 7. In particular, the linked frequency tables illustrated in FIG. 7 are premised on the use of a five-byte long scanning window. As such, the tables include a five-byte table, a four-byte table, a three-byte table and a two-byte table. FIG. 7 also illustrates numerous parent/child relationships between entries in the tables. In the context of the present invention, a parent bit string is a sub-string of an associated child bit string. In one example, a first parent bit string (or node) 702 in the four-byte table (0xFF, 0xFF, 0xFE, 0x12) has associated therewith a single child node 704 in the five-byte table (0xFF, 0xFF, 0xFE, 0x12, 0x00). Note that any parent string 702 may have associated therewith its own parent string 706. The table entries is FIG. 7 having boldfaced borders correspond to so-called end nodes, i.e., bit strings that do not have any child bit strings associate therewith. The numbers shown in parentheses for each table entry in FIG. 7 illustrate the respective number of times each bit string occurs within the uncompressed data. Because parent bit strings are sub-strings of their corresponding children bit strings, parent bit strings necessarily occur at least as frequently as their corresponding children bit strings and, in many instances, will occur more frequently.

Once the frequencies of the initial bit strings (that occur at least twice in the uncompressed data) from the first forward scan have been determined, it is desirable to perform entry reduction 414 to eliminate those bit strings represented in the linked frequency tables 412 that will not provide favorable compression savings relative to the compression savings that would otherwise be provided by the Huffman data. Stated another way, the available pool of bit strings can be reduced by determining which of the initial bit strings from the first forward scan, if any, offer favorable compression savings (assuming fixed length token substitution) relative to compression encoding based on the original Huffman data. To this end, Equation 1 below may be employed to determine the compression savings to be realized relative to the uncompressed data if a given bit string in the linked frequency tables 412 were to be substituted by a fixed length token. In a presently preferred embodiment, the longest bit strings represented in the linked frequency tables 412 are tested first, followed by bit strings of decreasing length. Per Equation 1, the savings using token replacement of a given bit string in number of bit, $s_i$, is determined by:

$$s_i = (n_i - b_e - b_t) * f_i - n_i \qquad \text{Equation 1}$$

where $n_i$, is the length in bits of the given bit string; be is the length in bits of an escape code to be associated with tokens;

$b_t$ is the length in bits of the fixed length token to be used to replace the bit string; and $f_i$ is the frequency of occurrence of the given bit string within the uncompressed data. The length in bits of the fixed length token, $b_t$, is determined by the maximum number of tokens to be used, which may be predetermined or a user-configurable variable. For example, if no more than 50 tokens are to be used, then the bit length of the fixed length tokens could be up to six bits (i.e., because $2^6$ provides 64 possible token values). If, however, no more than 100 tokens are desired, the bit length of the fixed length token could be up to seven bits (i.e., because $2^7$ provides 128 possible token values). In a presently preferred embodiment, the bit length of the fixed length tokens may not exceed eight bits, thereby providing, at most, 256 tokens. Additionally, in the preferred embodiment, the bit length of the escape code, be, is initially assumed to be 8 bits.

A calculation similar to that of Equation 1 can be made to determine the savings the original Huffman data 406 would provide relative to the uncompressed data if each byte of each occurrence of the given bit string is replaced by corresponding Huffman codes from the original Huffman data 406. If the savings offered by fixed length token replacement of the bit string are better than the savings offered by the use of the original Huffman data, then the bit string is a candidate for token replacement and is retained (along with its children bit strings, if any) in the linked frequency tables 412. If the savings offered by fixed length token replacement of the bit string are not better than the savings offered by the use of the original Huffman data, then the bit string is placed in a discard table 410. Preferably, bit strings are placed in the discard table 410 in ascending order to facilitate later look up of specific values, e.g., 0xFF occurs before 0xFF, 0x1F, which in turn occurs before 0xFF, 0x2F, etc. In the example of Table 1, the rightmost column illustrates the fact that certain ones of the initial bit strings from the first forward scan are retained in the linked frequency tables 412, whereas others are placed in the discard table 410.

At this point, the linked frequency tables 412 will include any multi-byte bit strings originally identified in the initial scan window position 502 during the first forward scan which offer token-based compression savings better than the compression savings otherwise available via Huffman encoding using the original Huffman data. Likewise, the discard table 410 will comprise any multi-byte bit strings that did not provide better compression savings relative to the original Huffman data. To continue the process, a second forward scan is thereafter initiated as illustrated in FIG. 5B. Thus, a second initial scan window position 522 is used to identify "new" initial bit strings in the manner previously described. In order to improve efficiency of the algorithm, any bit string identified in the second initial scan window position 522 is first compared to the bit strings found in the discard table 410 and the linked frequency table 412. If the bit string is found in either of these tables 410, 412, then it has already been fully considered as is ignored during the second forward scan. For example, the three-byte bit string, 0x37, 0x1F, 0xF4, although present in the second initial scan window position 522 has already been considered previously and placed in the discard table 410, as illustrated by Table 1 above. If the bit string is not found in either table 410, 412, it is retained at least temporarily as an initial bit string for the second forward scan. The frequencies of any other initial bit strings identified in this manner are then identified using advanced scan window positions 524–536 as described above. Once again, any of the initial bit strings resulting from the second initial scan window position 522 having a frequency of one are discarded. And again, those multi-byte bit initial bit strings offering better compression savings than the original Huffman data are identified using Equation 1 and retained in the linked frequency tables 412. Thereafter, successive forward scans are completed in the same manner until the end of the uncompressed data is reached. Note that as the tables 410, 412 become increasing populated as more forward scans are completed, subsequent forward scans should be completed quicker because the frequencies of fewer initial bit strings will need to be identified in the remainder of the uncompressed data.

The use of the progressively advanced initial scanning windows as described above limits the resources needed to identify the frequencies of multi-byte bit strings in comparison to true nth-order Huffman coding. In this manner, the present invention offers a substantially more efficient alternative to nth-order Huffman coding that retains many of the coding benefits (i.e., the ability to identify significant compression savings opportunities) of nth-order Huffman coding.

At the completion of all possible forward scans, all bit strings found in the linked frequency tables 412 are known to provide at least some token-based compression savings over the original Huffman data 406. Further entry reduction 414 of the linked frequency tables 412 may be optionally performed by identifying those child nodes or entries that do not offer token-based compression savings better than their respective parents. This may be expressed according to Equation 2:

$$[(n_i-b_e-b_i)*f_i-n_i] > [(n_i-b_e-b_i)*f_{i+1}-n_{i+1}-b_n*f_{i+1}] \quad \text{Equation 2}$$

where $n_i$ is the length in bits of the parent bit string; $b_e$ is the length in bits of an escape code to be associated with tokens; $b_t$ is the length in bits of the fixed length token to be used to replace the parent bit string; $f_i$ is the frequency of occurrence of the parent bit string within the uncompressed data; $f_{i+1}$ is the frequency of occurrence of the child bit string within the uncompressed data; and $b_n$ is the length in bits of the Huffman code that would be used to replace the last byte of the child bit string if the parent bit string were replaced by a token. Equation 2 is true if the compression savings offered by a given parent bit string (left side of the inequality symbol) are greater than the compression savings offered by the child bit strings (right side of the inequality symbol). If Equation 2 is true, the child node (and all of its children) may be eliminated from the linked frequency table. For example, with reference to FIG. 7, if a parent node 706 offers better compression performance than its child 702, then the child node 702 and its corresponding child node 704 would be eliminated from the linked frequency table 412.

After eliminating poor-performing child nodes from the linked frequency tables 412, specific bit strings from among the plurality of bit strings represented in the linked frequency tables 412 are selected 416 for token replacement. In essence, those bit strings offering the best token-based compression savings relative to Huffman coding are successively selected in decreasing order and assigned a unique token. This process continues until a desired number of tokens have been reached, or the maximum allowed number of tokens has been reached. In a presently preferred embodiment, this is accomplished by starting with the table corresponding to the longest bit strings (e.g., the 5 Byte Table in FIG. 7) in the linked frequency tables 412 and comparing the compression savings of each end node in that table relative to the Huffman coding using Equation 1 as described above. Recall that an end node (or end bit string) has no children nodes. The end node offering the best compression performance (relative to each other and the Huffman data) in that table is then assigned a token and removed from the linked frequency tables 412, and the frequencies of any related nodes (i.e., any node that is a sub-string of the selected node and all other child nodes of those sub-string nodes) are updated accordingly. Thereafter, the same process is repeated in successive tables corresponding to shorter bit strings (and having at least one end node) such that a token is assigned to a bit string from each table having at least one end node that performs better than the Huffman data. The process begins again with the table corresponding to the longest remaining bit strings and continues in this fashion until the desired (or maximum) number of tokens have been assigned, until all nodes in the linked frequency tables have been examined, or a certain number of consecutive unfavorable comparisons with the Huffman data occur. If, during any cycle of traversing end nodes in the linked frequency tables 412, no end node is found that compares favorably with the Huffman data, then the end nodes considered are eliminated from the linked frequency tables with the attendant updates to the frequencies of the related nodes and, assuming that none of the termination conditions have been met, the process begins again with the table corresponding to the longest bit strings and having at least one end node.

The last condition mentioned above for terminating selection and assignment of tokens reflects the fact that the Huffman data (starting with the original Huffman data 405) is updated 416 each time a bit string is selected and assigned a corresponding token to provide modified Huffman data 420. This is done because each such selection changes the byte-wise frequencies of occurrence within the uncompressed data of the constituent bytes of the selected bit string. This change in frequencies of occurrence of the constituent bytes will possibly change the performance of the Huffman data relative to the remaining uncompressed data. In particular, when the first bit string is selected for token replacement, a node or entry is added to the original Huffman data corresponding to the escape code and the frequency of occurrence of the escape code is updated to reflect the number of times the escape code occurs in conjunction with the token used to replace that first selected bit string. In a preferred embodiment, it is initially assumed that the escape code will be a byte in length. As successive bit strings are selected for token replacement, the node in the now-modified Huffman data corresponding to the escape code is successively updated by adding the frequencies of the selected bit strings. Conversely, as bit strings are selected, the frequencies of the constituent bytes of each selected bit string are decremented by a corresponding number. For example, if the two-byte bit string 0x3A, 0x19 occurring 50 times in the uncompressed data is selected for token replacement, then the frequencies in the Huffman data for the byte 0x3A and 0x19 are each decremented by 50. When a string is selected and modified Huffman data 420 is produced as a result, the subsequent bit string/token selection process is performed based on the newly modified Huffman data.

For example, with reference to FIG. 7, the two nodes in the 5-Byte Table are both end nodes and are considered first. Assume that the end node (0xFF, 0xFF, 0xFE, 0x12, 0x00) having reference numeral 704 is selected as the best performing of the two end nodes in the 5-Byte Table relative to the original Huffman data. As the first selected bit string, it is assigned a token (for example, a token value of 0) and removed from the 5-Byte Table. Additionally, to reflect the loss of the two occurrences of the selected bit string and the sub-strings which it encompassed, the frequencies of occurrence of the nodes having reference numerals 702, 706 and 708 are likewise reduced by two. Additionally, the original Huffman data is modified to reflect the selection of the bit string 704, as described above. Thereafter, the sole end node 720 in the 4-Byte Table is considered. Assuming that the end node 720 offers better compression savings in comparison to the now-modified Huffman data, it is also selected and assigned a token (for example, a token value of 1). As before, the frequencies of the ancestor nodes 724, 726 of the selected node 720 are decreased (in this case, by four). However, in this case, the frequencies of the children nodes 722, 728 of the first ancestor node 724 are also reduced (by four) to reflect the fact that loss of the selected node 720 effects at least some of the constituent bytes of those child nodes 722, 728. Once again, the Huffman data is modified to reflect the changes in frequency resulting from the selection of the selected node 720 and the process continues as previously described.

As noted above, this process is repeated until the desired (or maximum) number of tokens have been assigned, until all nodes in the linked frequency tables have been examined, or a certain number of consecutive unfavorable comparisons with the Huffman data (e.g., five) occur. At that point, the final length of each fixed length token can be set based on the number of tokens assigned by rounding up the value of $\log_2$(number of tokens). For example, if anywhere from 129 to 256 tokens have been assigned, the token length is set to eight bits. Conversely, if anywhere from 65 to 128 tokens have been assigned, the token length is set to seven bits in order to improve overall compression efficiency. Likewise, the escape code length is set in a similar manner to reflect the sum total of the frequencies of all tokens.

As a result of this token selection process, token tables 418 are created. The token tables 418 comprise listings of the selected variable-length bit strings and their corresponding fixed-length tokens. The tables 418 are preferably arranged according to the length of the various selected bit strings, e.g., a first table for four-byte bit strings and their corresponding tokens, a second table for three-byte bit strings and their corresponding tokens, etc. to facilitate later searching. With the token tables 418 thus established, compression 422 of the uncompressed data may occur. In particular, compression based on the token tables 418 is performed in conjunction with compression of the remaining uncompressed data based on the modified Huffman data 420, resulting in compressed data 424. Note that, in the worst-possible scenario in which no tokens were selected (meaning that no multi-byte strings were identified that performed better than 0-order Huffman coding), the compression process reverts to compression of all of the uncompressed data using the original Huffman data 406, i.e., 0-order Huffman encoding.

Referring once again to FIG. 3, this compression process is illustrated beginning at block 306 where token compression is performed. Using fixed-length token compression, each occurrence of each of the selected bit strings is replaced in the uncompressed data by the escape code and the bit string's corresponding token. Because the escape code is unique with respect to the codes resulting from the modified Huffman data 420, there will be no ambiguity when decompression is performed, as described below. When the token-based compression is completed, processing continues at block 308 where Huffman encoding is performed on the remaining uncompressed data. As known in the art, the Huffman encoding is performed by first assigning variable-length codes to the uncompressed one-byte patterns based on their respective frequencies of occurrence. Thereafter, the variable length codes are substituted for their corresponding one-byte patterns. In this manner, the present invention provides better compression performance by realizing some of the greater compression efficiencies typically available only to higher-order Huffman coding schemes in combination with the relative computational simplicity of 0-order Huffman coding.

Note that, because the compression provided by the instant invention is performed in-place and not in a sequential manner, it is possible to retain knowledge, relative to the compressed data, about the boundaries between multiple data items originally present in the uncompressed data. Thus, at block 310, a data item index may be created listing the locations of respective data items relative to the structure of the compressed data. For example, assume the uncompressed data originally consisted of three data items, the first of which was x bytes in length, the second of which was y bytes in length and the third of which was z byte in length. Based on the compression, it may be determined that the length of the first data item after compression is now (x−a) bytes and the length of the second data item after compression is now (y−b) bytes. (As the example below illustrates, knowledge that the third and last data item after compression is now (z−c) bytes in length is not necessary in order to randomly reconstruct the respective data items.) Thus, it follows that the beginning of the second data item in the compressed data is at the (x−a+1)'th byte in the compressed data, and the beginning of the third data item in the compressed data is the (x+y−a−b+1)'th byte in the uncompressed data. To retrieve only the first data item, decompression must be performed on the first through (x−a)'th bytes of the compressed data; to retrieve only the second data item, decompression must be performed on the (x−a+1)'th byte through the (x+y−a−b)'th byte of the compressed data; and to retrieve only the third data item, decompression must be performed on the (x+y−a−b+1)'th byte through the last byte of the compressed data. As this example illustrates, knowledge of the borders in the uncompressed data after the (x−a)'th byte and the (x+y−a−b)'th byte allows data items in the uncompressed data to be randomly accessed during decompression. Note that, in practice, the compressed data does not necessarily reside on byte boundaries, as in the above example. In practice, separate bit-wise boundaries, or even, byte, word, or longer byte boundaries can be used as described above with respect to byte boundaries.

Thereafter, at block 312, the compressed data and other compression-related information necessary to decompress the compressed data may be sent to a recipient of the compressed data. An exemplary data structure for this purpose is illustrated with respect to FIG. 8. In addition to the compressed data 802, at least the token tables 806, token information 808 and Huffman data 810 are concatenated for transmission. As noted above, the token tables 806 list the correspondence of the selected variable-length bit strings to the fixed-length tokens used to replace them. The token information 808 at least includes information identifying the escape code. The token information 808 may also comprise information regarding the total number of tokens being used, the fixed token length (although this could be derived from the total number of tokens used) and, where the token tables are arranged according to lengths of the selected bit strings, the number of entries within the token tables corresponding to each bit string length (e.g., there are twenty tokens corresponding to five-byte bit strings, there are thirty-five tokens corresponding to four-byte bit strings, etc.) The Huffman data 810, like the token tables 806, lists the correspondence of the one-byte uncompressed data patterns to the variable length Huffman codes (based on either the original or modified Huffman data). Optionally, the data structure may also include a data item index 804, as described above, for identifying individual data items within the compressed data. Assuming the compression savings realized by the above-described compression scheme is greater than the overhead required to transmit the various information fields 804–810, an overall compression savings is realized.

Figure 9:
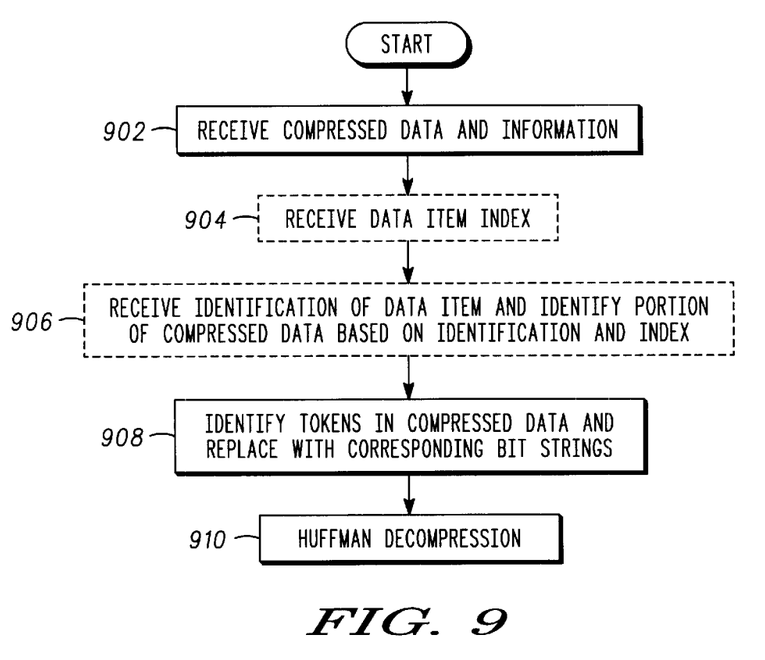
FIG. 9 is a flow chart illustrating a method for decompressing data in accordance with an embodiment of the present invention.
Figure 10:
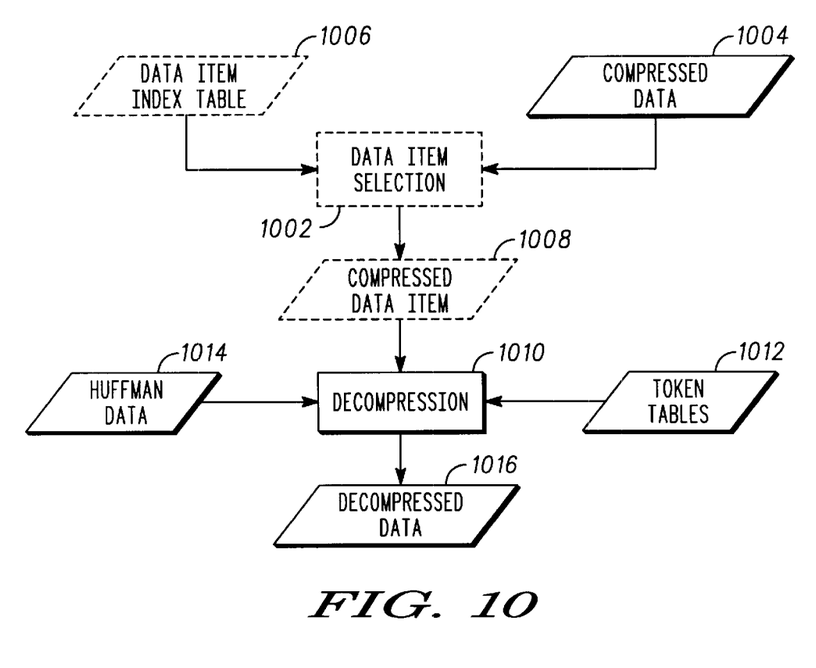
FIG. 10 is a block diagram illustrating data flow and decompression-related processing in accordance with an embodiment of the present invention.

Based on the transmitted information, a receiving device may perform decompression processing to reconstruct the uncompressed data. This is further illustrated with reference to FIGS. 9 and 10. In particular, FIG. 9 illustrates a method for decompression in accordance with the present invention and FIG. 10 illustrates data flow in accordance with the decompression method. In one embodiment of the present invention, the processing described with reference to FIGS. 9 and 10 may be implemented as stored software routines executed by processors, as described above. Those having ordinary skill in the art will recognize that other techniques for implementing such processes, including the use of dedicated circuitry and the like, may be equally employed as a matter of design choice.

Figure 8:
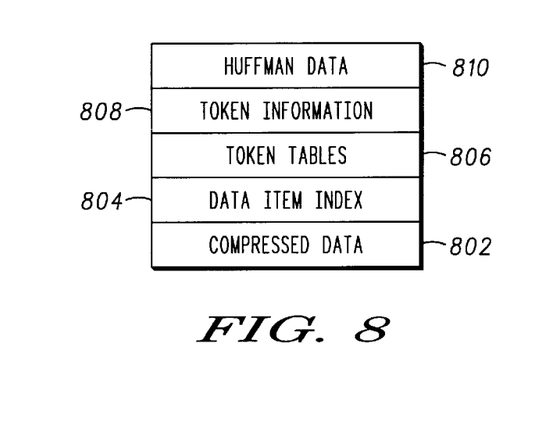
FIG. 8 illustrates a data structure for transmitting compressed data in accordance with an embodiment of the present invention.

Beginning at block 902, a receiving device at least receives compressed data 802 and other compression-related information 806–810 as described above. The receiving device may comprise any mobile device such as wireless communication devices at least capable of receiving information streams that include compressed data, including cellular phones, two-way radios, wirelessly-enabled personal digital assistants or computers, etc. With reference to FIG. 10, the compressed data and other compression-related information may be stored in a compressed data table 1004. Likewise, the token tables 1012 and Huffman data 1014 are stored in suitable locations. Additionally, at block 904, a data item index 804 may also be received and stored in a data item index table 1006. If the data item index is available, thereby making individual data items within the compressed data randomly accessible, an identification of a particular data item or items may be received at block 906. The identification of the data item(s) may be provided through a user input device or may be automatically provided by an application or other process executing on the receiving device. Regardless, the identification of the data item(s) may be used to access 1002 the data item index table 1006 to determine where to go in the compressed data 1004 to retrieve the requested data item(s). As a result, one or more compressed data items 1008 are thereafter available for decompression processing. Note that, in the simplest case in which a data item index is not provided, the compressed data 1008 to be decompressed may in fact comprise the entirety of the compressed data, regardless of whether one or more data items are represented in the compressed data.

Thereafter, decompression processing 1010 is performed, based alternately on the token tables 1012 and the Huffman data 1014, to provide decompressed data 1016. This is further illustrated in FIG. 9 by blocks 908 and 910 where tokens in the compressed data are identified and replaced by their corresponding bit strings and, in a similar manner, Huffman codes are identified an replaced by their corresponding one-byte patterns. In particular, the compressed data 1008 is traversed from the start looking for occurrences of Huffman codes or the escape code. Note that the escape code is unique relative to the Huffman codes used during the compression process. Using known techniques, each occurrence of a Huffman code is identified and used to access the Huffman data 1014 to identify the corresponding one-byte pattern, which pattern is thereafter substituted for the Huffman code in the decompressed data 1016. When, however, the escape code is identified, a fixed length token associated with the escape code is also identified (e.g., the n bits following the escape code where n is the fixed length of tokens in number of bits). The token is used to access the token tables 1012 to identify the corresponding bit string. The escape code and corresponding token are thereafter replaced by the identified bit string in the decompressed data 1016. This process of identifying Huffman codes and escape codes/tokens and replacing them with corresponding one-byte patterns and bit strings, respectively, is continued through to the end of the compressed data 1008. In this manner, the compressed data, which may be randomly accessed, may also be very quickly decompressed.

The present invention provides a technique for s for compressing and decompressing virtually any type of data without prior knowledge of the characteristics of the data while still preserving random accessibility to individual items within the compressed data. This is accomplished by combining lower-order Huffman coding with fixed-length token replacement of multi-byte bit strings. Candidate bit strings are quickly identified by comparing token-based compression savings for each identified bit string with compression savings that would otherwise be available through the use of the lower-order Huffman compression. Furthermore, the use of the token compression in conjunction with the Huffman compression allows data items to be compressed such that they are still randomly accessible within the resulting compressed data. Using this technique, better compression efficiencies may be obtained without detailed knowledge of the data items being compressed or the complexity of higher-order Huffman encoding.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantages, or solution to occur or become more pronounced are not to be construed as a critical, required, or essential features or elements of any or all the claims. As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article,or apparatus.

I claims:

1. A method for compressing uncompressed data, the method comprising:
   performing Huffman coding of the uncompressed data to provide original Huffman data;
   identifying at least one bit string in the uncompressed data that may be replaced by corresponding ones of at least one fixed length token such that compression of the uncompressed data based on the at least one fixed length token is favorable in comparison to compression of the uncompressed data based on the original Huffman data; and
   compressing the uncompressed data based at least in part upon the at least one fixed length token to provide compressed data.

2. The method of claim 1, further comprising:
   modifying the original Huffman data based on replacement of the at least one bit string by the corresponding ones of the at least one fixed length token to provide modified Huffman data; and
   compressing the uncompressed data based at least in part upon the modified Huffman data.

3. The method of claim 2, wherein compressing the uncompressed data based at least in part upon the fixed length token further comprises replacing each of the at least one bit string in the uncompressed data with an escape code and the corresponding one of the at least one fixed length token.

4. The method of claim 3, further comprising:
   transmitting at least the compressed data, information regarding correspondence of the at least one bit string to the at least one fixed length token and information regarding the escape code to a receiver.

5. The method of claim 4, wherein transmitting further comprises transmitting, to the receiver, information regarding the modified Huffman data.

6. The method of claim 4, wherein the uncompressed data comprises a plurality of data items, the method further comprising:
   determining an index of the plurality of data items relative to the compressed data;
   transmitting the index to the receiver.

7. A method for uncompressing compressed data, the method comprising:
   receiving the compressed data, information regarding correspondence of at least one bit string to at least one fixed length token and information regarding an escape code;
   identifying, within at least some of the compressed data, occurrences of the escape code and, for each occurrence of the escape code, a fixed length token associated therewith;
   for each occurrence of the escape code, identifying a bit string of the at least one bit string corresponding to the fixed length token associated with the occurrence of the escape code; and
   for each occurrence of the escape code, replacing the escape code and the fixed length token associated with the occurrence of the escape code with the bit string corresponding to the fixed length token.

8. The method of claim 7, further comprising:
   receiving Huffman data comprising at least one variable length code having associated therewith a corresponding one of at least one replacement symbol;
   identifying, within the at least some of the compressed data, occurrences of the at least one variable length code;
   for each occurrence of the at least one variable length code, identifying the corresponding one of the at least one replacement symbol; and
   for each occurrence of the at least one variable length code, replacing the occurrence of the variable length code with the corresponding one of the at least one replacement symbol.

9. The method of claim 7, further comprising:
   receiving an index of a plurality of data items relative to the compressed data;

receiving identification of a data item of the plurality of data items;

identifying a portion of the compressed data corresponding to the identification of the data based on the index; and designating the portion of the compressed data as the at least some of the compressed data.

10. A method for selecting tokens for use in compressing uncompressed data, the method comprising steps of:

performing Huffman coding of the uncompressed data to provide original Huffman data;

determining frequencies of occurrence of a plurality of variable bit length strings in the uncompressed data to provide frequency data;

comparing compression performance of the original Huffman data with compression performance of at least one variable length bit string of the plurality of variable length bit strings based on the frequency data, wherein each of the at least one variable length bit strings is to be replaced by a corresponding one of at least one fixed length token during compression of the uncompressed data; and selecting, for replacement by the corresponding ones of the at least one fixed length token, those variable length bit strings of the at least one variable length bit string for which the compression performance compares favorably with the original Huffman data.

11. The method of claim 10, wherein performing the Huffman coding further comprises performing 0-order Huffman coding.

12. The method of claim 10, further comprising:

compressing the uncompressed data based at least in part upon the at least one fixed length token.

13. The method of claim 10, wherein comparing compression performance of the original Huffman data with compression performance of the at least one variable length bit string based on the frequency data further comprises:

selecting as the at least one variable length bit string those variable length bit strings of the plurality of variable length bit strings having greatest compression savings with respect to the original Huffman data.

14. The method of claim 10, further comprising:

modifying the original Huffman data based on replacement of the at least one variable length bit string by the corresponding ones of the at least one fixed length token to provide modified Huffman data; and comparing compression performance of the modified Huffman data with compression performance of at least one remaining variable length bit string of the plurality of variable length bit strings based on the frequency data, wherein each of the at least one remaining variable length bit strings is to be replaced by a corresponding one of at least one additional fixed length token during compression of the uncompressed data.

15. The method of claim 14, further comprising:

compressing the uncompressed data based at least in part upon the modified Huffman data.

16. An apparatus for compressing uncompressed data, comprising:

a processor;

at least one storage device, coupled to the processor, having stored thereon executable instructions that, when executed by the processor, cause the processor to:

perform Huffman coding of the uncompressed data to provide original Huffman data;

identify at least one bit string in the uncompressed data that may be replaced by corresponding ones of at least one fixed length token such that compression of the uncompressed data based on the at least one fixed length token is favorable in comparison to compression of the uncompressed data based on the original Huffman data; and compress the uncompressed data based at least in part upon the at least one fixed length token to provide compressed data.

17. The apparatus of claim 16, wherein the at least one storage device further comprises executable instructions that, when executed by the processor, cause the processor to:

modify the original Huffman data based on replacement of the at least one bit string by the corresponding ones of the at least one fixed length token to provide modified Huffman data; and identify at least one other bit string in the uncompressed data that may be replaced by corresponding ones of at least one additional fixed length token such that compression of the uncompressed data based on the at least one additional fixed length token is favorable in comparison to compression of the uncompressed data based on the modified Huffman data.

18. The apparatus of claim 17, wherein the at least one storage device further comprises executable instructions that, when executed by the processor, cause the processor to:

compress the uncompressed data based at least in part upon the modified Huffman data.

19. The apparatus of claim 18, wherein the executable instructions that cause the processor to compress the uncompressed data based at least in part upon the fixed length token further comprises executable instructions that, when executed by the processor, cause the processor to:

replace each of the at least one bit string in the uncompressed data with an escape code and the corresponding one of the at least one fixed length token.

20. The apparatus of claim 19, further comprising a transmitter coupled to the processor, wherein the at least one storage device further comprises executable instructions that, when executed by the processor, cause the processor to:

transmit, via the transmitter, at least the compressed data, information regarding correspondence of the at least one bit string to the at least one fixed length token and information regarding the escape code.

21. The apparatus of claim 20, wherein the at least one storage device further comprises executable instructions that, when executed by the processor, cause the processor to:

transmit, via the transmitter, information regarding the modified Huffman data.

22. An apparatus for decompressing compressed data, comprising:

a receiver;

a processor coupled to the receiver;

at least one storage device, coupled to the processor, having stored thereon executable instructions that, when executed by the processor, cause the processor to:

receive, via the receiver, the compressed data, information regarding correspondence of at least one bit string to at least one fixed length token and information regarding an escape code;

identify, within at least some of the uncompressed data, occurrences of the escape code and, for each occurrence of the escape code, a fixed length token associated therewith;

for each occurrence of the escape code, identify a bit string of the at least one bit string corresponding to the fixed length token associated with the occurrence of the escape code; and for each occurrence of the escape code, replace the escape code and the fixed length token associated with the occurrence of the escape code with the bit string corresponding to the fixed length token.

23. The apparatus of claim 22, wherein the at least one storage device further comprises executable instructions that, when executed by the processor, cause the processor to:

receiving, via the receiver, Huffman data comprising at least one variable length code having associated therewith a corresponding one of at least one replacement symbol;

identify, within the at least some of the compressed data, occurrences of the at least one variable length code;

for each occurrence of the at least one variable length code, identify the corresponding one of the at least one replacement symbol; and for each occurrence of the at least one variable length code, replace the occurrence of the variable length code with the corresponding one of the at least one replacement symbol.

24. The apparatus of claim 22, wherein the at least one storage device further comprises executable instructions that, when executed by the processor, cause the processor to:

receive, via the receiver, an index of a plurality of data items relative to the compressed data;

receive identification of a data item of the plurality of data items;

identify a portion of the compressed data corresponding to the identification of the data based on the index; and designate the portion of the compressed data as the at least some of the compressed data.

25. A wireless communication device comprising the apparatus of claim 22.

26. A wireless communication device comprising the apparatus of claim 23.

27. A wireless communication device comprising the apparatus of claim 24.

28. An apparatus for selecting tokens for use in compressing uncompressed data, comprising:

a processor;

at least one storage device, coupled to the processor, having stored thereon executable instructions that, when executed by the processor, cause the processor to:

perform Huffman coding of the uncompressed data to provide original Huffman data;

determine frequencies of occurrence of a plurality of variable bit length strings in the uncompressed data to provide frequency data;

compare compression performance of the original Huffman data with compression performance of at least one variable length bit string of the plurality of variable length bit strings based on the frequency data, wherein each of the at least one variable length bit strings is to be replaced by a corresponding one of at least one fixed length token during compression of the uncompressed data; and select, for replacement by the corresponding ones of the at least one fixed length token, those variable length bit strings of the at least one variable length bit string for which the compression performance compares favorably with the original Huffman data.

29. The apparatus of claim 28, wherein the at least one storage device further comprises executable instructions that, when executed by the processor, cause the processor to:

compress the uncompressed data based at least in part upon the at least one fixed length token.

30. The apparatus of claim 28, wherein the at least one storage device further comprises executable instructions that, when executed by the processor, cause the processor to:

modify the original Huffman data based on replacement of the at least one variable length bit string by the corresponding ones of the at least one fixed length token to provide modified Huffman data; and compare compression performance of the modified Huffman data with compression performance of at least one remaining variable length bit string of the plurality of variable length bit strings based on the frequency data, wherein each of the at least one remaining variable length bit strings is to be replaced by a corresponding one of at least one additional fixed length token during compression of the uncompressed data.

31. The apparatus of claim 30, wherein the at least one storage device further comprises executable instructions that, when executed by the processor, cause the processor to:

compress the uncompressed data based at least in part upon the modified Huffman data.

32. A method for selecting candidate variable-length bit strings from within uncompressed data for use in fixed length token based compression, the method comprising:

iteratively repeating the steps of:

identifying, in a scan window at an initial scan position, at least one initial variable-length bit string from within uncompressed data encompassed by the scan window at the initial scan position;

repetitively advancing the scan window through the uncompressed data to a plurality of advanced scan positions relative to the initial scan position; and at each advanced scan position of the plurality of advanced scan positions, identifying occurrences of any of the at least one initial variable-length bit string within the uncompressed data within the advanced scan window and incrementing corresponding frequency data for the identified ones of the at least one initial variable-length bit string, wherein, for each iteration, the initial scan position is advanced until the end of the uncompressed data is reached.

33. The method of claim 32, further comprising:

performing Huffman coding of the uncompressed data to provide Huffman data.

34. The method of claim 33, further comprising, for each iteration:

comparing compression performance of the Huffman data with compression performance of at least one variable length bit string of the at least one variable length bit string based on the frequency data, wherein each of the at least one variable length bit strings is to be replaced by a corresponding one of at least one fixed length token during compression of the uncompressed data.

* * * * *